(12) United States Patent
Fujimoto et al.

(10) Patent No.: US 8,058,774 B2
(45) Date of Patent: Nov. 15, 2011

(54) VIBRATING PLATE PIEZOELECTRIC GENERATOR

(75) Inventors: Katsumi Fujimoto, Nagaokakyo (JP);
Chikahiro Horiguchi, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/004,137

(22) Filed: Jan. 11, 2011

(65) Prior Publication Data

US 2011/0121685 A1    May 26, 2011

Related U.S. Application Data

(63) Continuation of application No. PCT/JP2009/003067, filed on Jul. 2, 2009.

(30) Foreign Application Priority Data

Jul. 14, 2008  (JP) ................................. 2008-182576

(51) Int. Cl.
*H01L 41/08* (2006.01)
*H04R 17/00* (2006.01)

(52) U.S. Cl. ........ 310/324; 310/328; 310/329; 310/351; 310/355; 381/190

(58) Field of Classification Search .................. 310/324, 310/328, 329, 351, 355; 381/190
See application file for complete search history.

(56) References Cited

U.S. PATENT DOCUMENTS

| | | | | |
|---|---|---|---|---|
| 3,683,129 A | * | 8/1972 | Jan Roos et al. .............. | 381/116 |
| 3,707,131 A | * | 12/1972 | Massa ........................... | 310/324 |
| 3,786,202 A | * | 1/1974 | Schafft .......................... | 310/324 |
| 4,176,524 A | * | 12/1979 | Kamiyama et al. ............. | 62/140 |
| 4,389,548 A | * | 6/1983 | Morikawa et al. ............... | 381/190 |
| 4,414,436 A | * | 11/1983 | Sashida et al. ................. | 381/152 |
| 4,430,529 A | * | 2/1984 | Nakagawa et al. ........... | 381/190 |
| 4,461,930 A | * | 7/1984 | Melillo et al. ................. | 381/190 |
| 4,475,014 A | * | 10/1984 | King ............................. | 381/190 |
| 4,554,414 A | * | 11/1985 | House ........................... | 381/182 |
| 4,593,160 A | * | 6/1986 | Nakamura .................... | 381/163 |
| 4,597,099 A | * | 6/1986 | Sawafuji ........................ | 381/190 |
| 4,705,981 A | * | 11/1987 | Inoue et al. .................... | 310/324 |
| 5,118,981 A | * | 6/1992 | Kobayashi et al. ............ | 310/329 |
| 5,962,952 A | * | 10/1999 | Gluszyk et al. ................ | 310/324 |

(Continued)

FOREIGN PATENT DOCUMENTS

JP    01315279 A    *    12/1989

(Continued)

OTHER PUBLICATIONS

PCT/JP2009/003067 International Search Report dated Sep. 18, 2009.

(Continued)

*Primary Examiner* — Jaydi San Martin
(74) *Attorney, Agent, or Firm* — Dickstein Shapiro LLP

(57) ABSTRACT

A piezoelectric generator that includes a piezoelectric element having first and second surfaces on which a first electrode and a second electrode are disposed. A vibrating plate is bonded to the piezoelectric element such that the first surface is adjacent thereto. The vibrating plate includes a first bend disposed at a first side of a vibrating-plate main section to which the piezoelectric element is bonded and a second bend disposed at a second side thereof. A support member supports the vibrating plate at a location outside the first and second bends. A vibration body including the vibrating-plate main section and the piezoelectric element is supported at both ends.

8 Claims, 4 Drawing Sheets

U.S. PATENT DOCUMENTS

| | | | |
|---|---|---|---|
| 7,633,207 B2 * | 12/2009 | Sakamoto | 310/323.09 |
| 7,692,363 B2 * | 4/2010 | Butler et al. | 310/329 |
| 7,952,258 B2 * | 5/2011 | Mori | 310/323.01 |
| 2011/0095649 A1 * | 4/2011 | Kagayama et al. | 310/323.01 |

FOREIGN PATENT DOCUMENTS

| | | | |
|---|---|---|---|
| JP | 06261565 A * | 9/1994 | |
| JP | 7-107752 A | 4/1995 | |
| JP | 09225401 A * | 9/1997 | |
| JP | 10126885 A * | 5/1998 | |
| JP | 10192782 A * | 7/1998 | |
| JP | 2001-231273 | 8/2001 | |
| JP | 2002-252989 A | 9/2002 | |
| JP | 2007-166881 A | 6/2007 | |
| JP | 2007144911 A * | 6/2007 | |
| JP | 2007150037 A * | 6/2007 | |
| JP | 2007-281015 B1 | 7/2007 | |

OTHER PUBLICATIONS

PCT/JP2009/003067 Written Opinion dated Sep. 18, 2009.

* cited by examiner

VIBRATING PLATE PIEZOELECTRIC GENERATOR

CROSS REFERENCE TO RELATED APPLICATIONS

The present application is a continuation of International Application No. PCT/JP2009/003067, filed Jul. 2, 2009, which claims priority to Japanese Patent Application No. JP2008-182576, filed Jul. 14, 2008, the entire contents of each of these applications being incorporated herein by reference in their entirety.

FIELD OF THE INVENTION

The present invention relates to a piezoelectric generator that is vibrated by undergoing acceleration or distortion and generates electric power by the piezoelectric effect and, more specifically, to a piezoelectric generator having a structure in which a piezoelectric element including a piezoelectric ceramic body is fixed to a vibrating plate.

BACKGROUND OF THE INVENTION

Traditionally, there are known piezoelectric generators that are vibrated by undergoing acceleration or distortion and generate electric power by the piezoelectric effect. When such piezoelectric generators are used as a power source, other power sources, such as batteries, are not necessary. Accordingly, these piezoelectric generators are suitably used as a power source for various sensors in applications subjected to vibration or distortion.

One example of the above piezoelectric generators is disclosed in PTL 1 below. FIG. 6 is a schematic partial cut-away front cross-sectional view that illustrates a piezoelectric generator described in PTL 1.

A piezoelectric generator 101 includes a substrate 102 made of silicon. A circular hole 102a is disposed in the upper surface of the substrate 102. An electrode 104 is disposed on the upper surface of the substrate 102. A discoid piezoelectric element 103 is fixed so as to close the circular hole 102a. The piezoelectric element 103 includes a piezoelectric plate 103a made of polyvinylidene fluoride, a first electrode 103b disposed on the upper surface of the piezoelectric plate 103a, and a second electrode 103c disposed on the lower surface thereof.

The second electrode 103c is electrically coupled to the electrode 104. An electrode 105 is disposed on the upper surface of the substrate 102 at a site spaced away from the electrode 104. The electrode 105 is electrically coupled to the first electrode 103b with a bonding wire 106.

A weight 107 is fixed to the upper surface of the piezoelectric element 103. When the piezoelectric generator 101 undergoes vibration accompanying acceleration or distortion, the portion to which the weight 107 is fixed vibrates in the directions indicated by the arrows. Charge based on this vibration is extracted from the first and second electrodes 103b and 103c.

PTL 1 also describes a both-end support type piezoelectric generator as a modified example of the above-described piezoelectric generator 101. Although not individually illustrated, the both-end support type piezoelectric generator is described as having substantially the same cross-sectional structure as that of the piezoelectric generator 101 illustrated in FIG. 6. That is, the piezoelectric generator 101 uses the piezoelectric element 103 having a circular planar shape so as to close the circular hole 102a, whereas, for the both-end support type piezoelectric element, both ends of a rectangular piezoelectric element are fixed in a similar way to that illustrated in FIG. 6 such that the piezoelectric element is supported at the both ends.

PTL 1: Japanese Unexamined Patent Application Publication No. 7-107752

Traditionally, a piezoelectric generator that includes a piezoelectric element supported by a cantilever is known. For that piezoelectric generator, there is a problem in that the resonance frequency of vibration when, for example, acceleration is applied tends to vary.

In contrast to this, a piezoelectric generator including a piezoelectric element supported at both ends is considered to be able to reduce variations in the resonance frequency of vibration. However, in reality, for a piezoelectric generator that has a cross-sectional structure illustrated in FIG. 6 and that is a structure in which a piezoelectric element is supported at both ends, the resonance frequency tends to vary depending on conditions of installation, and the power generation efficiency also tends to vary.

SUMMARY OF THE INVENTION

It is an object of the present invention to provide a piezoelectric generator and a method of manufacturing the same, the piezoelectric generator overcoming the above-described drawbacks in the related art and having a structure in which a piezoelectric element is supported at both ends, the piezoelectric generator in which variations in the resonance frequency caused by conditions of installation do tend to occur and thus variations in the power generation efficiency are further reduced.

According to the present invention, a piezoelectric generator is provided. The piezoelectric generator includes a piezoelectric element including a piezoelectric ceramic body and first and second electrodes, the piezoelectric ceramic body having first and second surfaces facing each other, the first and second electrodes being disposed on the first and second surfaces of the piezoelectric ceramic body, respectively, and a vibrating plate on which the piezoelectric element is placed such that the first or second surface is adjacent thereto. The vibrating plate includes a vibrating-plate main section on which the piezoelectric element is placed, a first bend disposed at one side of the vibrating-plate main section, and a second bend disposed at an opposite side thereof such that the piezoelectric element is positioned between the first and second bends. The piezoelectric generator further includes a support member supporting the vibrating plate at a location outside the first and second bends of the vibrating plate. A vibration portion including the piezoelectric element and the vibrating-plate main section is supported at both ends.

For a specific aspect of the piezoelectric generator according to the present invention, the first and second bends are symmetrical with respect to the piezoelectric element. In this case, the symmetry of a structure supporting the piezoelectric element is enhanced, and thus variations in the resonance frequency caused by conditions of installation of the piezoelectric element can be further reduced.

For another specific aspect of the piezoelectric generator according to the present invention, the vibrating plate is made of ceramic and formed by firing integral with the piezoelectric element. In this case, the piezoelectric generator according to the present invention can be provided efficiently and inexpensively by the use of an integral firing technique. In particular, when the support member is made of ceramic and formed by firing integral with the vibrating plate, in addition to the piezoelectric element and the vibrating plate, the support member is also formed by integral firing. Therefore, the manufacturing efficiency can be further enhanced, and the piezoelectric generator can be provided more inexpensively.

For still another specific aspect of the piezoelectric generator according to the present invention, a mass load member provided on the piezoelectric element is further included. In this case, vibration occurring when acceleration or distortion is applied can be increased, and this can enhance the power generation efficiency.

A method of manufacturing a piezoelectric generator according to the present invention is a method of manufacturing a piezoelectric generator according to the present invention and includes the steps of preparing a structure in which a plurality of piezoelectric elements and a plurality of support members are integral with a mother vibrating plate and obtaining piezoelectric generators by cutting the structure.

For a specific aspect of the method of manufacturing a piezoelectric generator according to the present invention, the structure in which the mother vibrating plate, the plurality of piezoelectric elements, and the plurality of support members are integral with each other is prepared by a ceramic integral firing technique. Accordingly, for the obtainment of the above mother structure, by the use of the ceramic integral firing technique, the mother vibrating plate, the plurality of piezoelectric elements, and the plurality of support members can be obtained at one time. Therefore, the manufacturing efficiency can be enhanced, and the cost of a piezoelectric generator can be reduced.

With a piezoelectric generator according to the present invention, a vibrating plate includes first and second bends, and a vibration body including a piezoelectric element and a vibrating-plate main section is supported at both ends by the first and second bends. Therefore, variations in the resonance frequency can be smaller than those for a piezoelectric generator having a cantilever support structure. Additionally, because it is supported by the first and second bends, variations in the resonance frequency caused by conditions of installation do not tend to occur. Accordingly, variations in the power generation efficiency can be reduced.

With a method of manufacturing a piezoelectric generator according to the present invention, after the above-described mother structure having a mother vibrating plate, a plurality of piezoelectric elements, and a plurality of support members is prepared, piezoelectric generators can be obtained by cutting the mother structure in its thickness direction. Therefore, a piezoelectric generator with reduced variations in the resonance frequency and in the power generation efficiency according to the present invention can be obtained efficiently, and the cost of each piezoelectric generator can be reduced.

DETAILED DESCRIPTION OF THE INVENTION

The present invention is clarified below by describing concrete embodiments of the present invention with reference to the drawings.

Figure 1A:
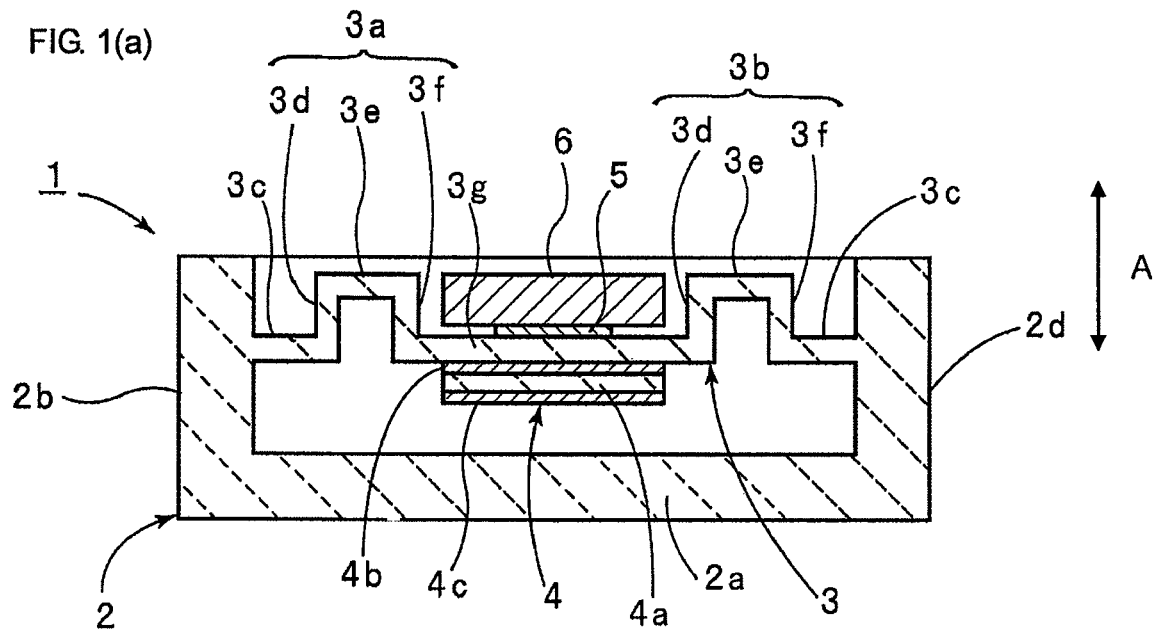
FIGS. 1(a) and (b) are a front cross-sectional view of a piezoelectric generator according to a first embodiment of the present invention and a perspective view that illustrates an outer appearance thereof.

FIGS. 1(a) and (b) are a front cross-sectional view of a piezoelectric generator according to an embodiment of the present invention and a perspective view that illustrates an outer appearance thereof.

A piezoelectric generator 1 includes a support member 2 made of ceramic. Specifically, the support member 2 includes a rectangular plate base 2a and a plurality of side walls 2b to 2e upwardly extending from the outer edge of the base 2a.

The side wall 2b and the side wall 2d face each other, and the side wall 2c and the side wall 2e face each other. The length in a direction connecting the side walls 2b and 2d is longer than that in a direction connecting the side walls 2c and 2e.

A vibrating plate 3 extending between the side walls 2b and 2b facing each other is disposed. For the present embodiment, the vibrating plate 3 is made of ceramic and formed by firing integral with the support member 2. A first end of the vibrating plate 3 is coupled to an internal surface of the side wall 2b, and a second end thereof is coupled to the side wall 2d, which is opposite to the side wall 2b.

The dimension of the support member 2 in its width direction, that is, the dimension in a direction connecting the side walls 2c and 2e is shorter than the dimension between the side walls 2c and 2e. Accordingly, as illustrated in FIG. 2, the vibrating plate 3 is arranged in a central portion in a width direction in a space surrounded by the side walls 2b to 2e of the support member 2.

The vibrating plate 3 includes first and second bends 3a and 3b. The first bend 3a includes a first section 3d, a second section 3e, and a third section 3f. The first section 3d extends upwardly from the inner end of a horizontally extending coupling section 3c connected to the inner surface of the side wall 2b of the support member 2. The second section 3e horizontally extends from the upper end of the first section 3d. The third section 3f downwardly extends from the inner end of the second section 3e. Similarly, the second bend 3b also includes a first section 3d, a second section 3e, and a third section 3f. A horizontally extending vibrating-plate main section 3g is arranged so as to link the lower end of the third section 3f of the first bend 3a and the lower end of the third section 3f of the second bend 3b. A piezoelectric element 4 is bonded to the lower surface of the vibrating-plate main section 3g.

For the present invention, the piezoelectric element is placed on the vibrating plate and bonded thereto. Here, "bonded" also includes a structure in which they are integrated with each other by integral firing, as described above, and is not limited to a structure in which the piezoelectric element is fixed by the use of adhesive or bond.

Figure 2:
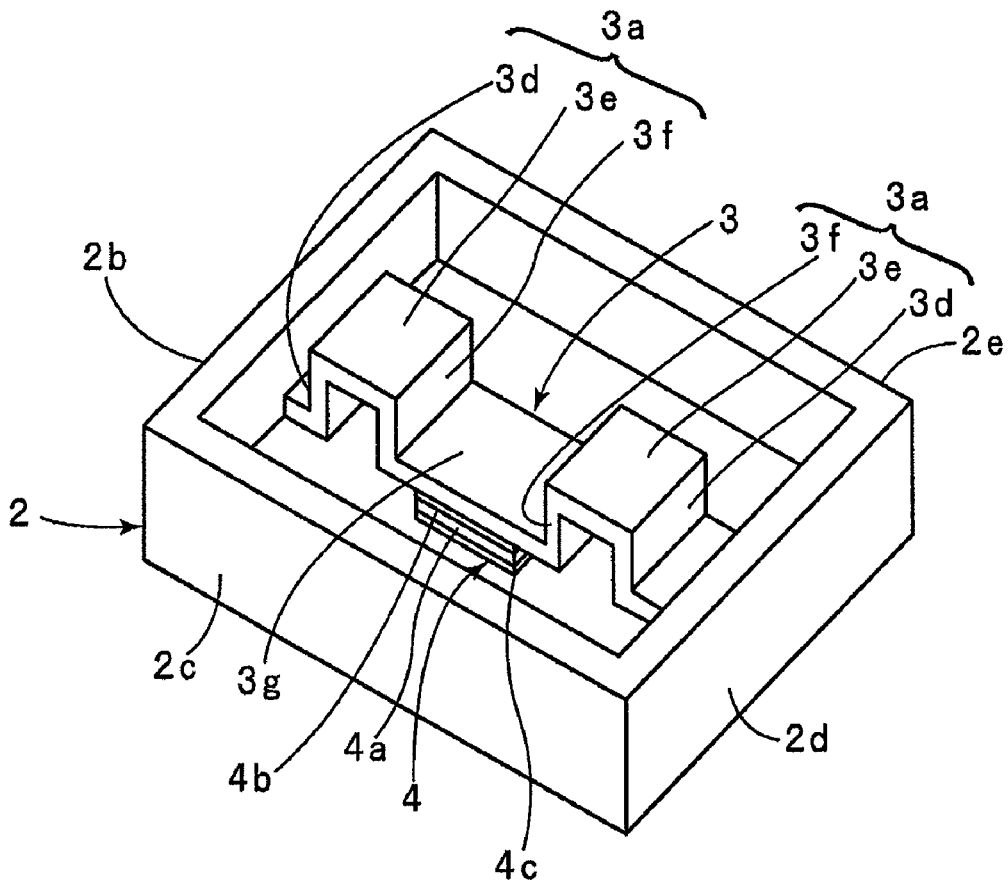
FIG. 2 is a perspective view that illustrates a state in which a mass load member is placed in a piezoelectric generator according to the present invention.

The vibrating-plate main section 3g is a flat plate section, and its longitudinal direction is the same as the longitudinal direction of the support member 2, as illustrated in FIG. 2.

The first and second bends 3a and 3b are symmetrically arranged such that the piezoelectric element 4 is disposed therebetween.

The piezoelectric element 4 includes a piezoelectric plate 4a as a piezoelectric ceramic body, a first electrode 4b disposed on the upper surface of the piezoelectric plate 4a, and a second electrode 4c disposed on the lower surface of the piezoelectric plate 4a.

For the present embodiment, the piezoelectric plate 4a is made of PZT piezoelectric ceramics. However, the piezoelectric plate 4a may be made of other piezoelectric ceramics.

For the present embodiment, the first and second electrodes 4b and 4c are formed by applying and baking conductive metal paste. This baking of conductive metal paste is performed in firing of the piezoelectric plate 4a. For the present embodiment, the piezoelectric plate 4a is fired by the use of a technique of firing integral with the support member 2 and the vibrating plate 3.

For the present embodiment, the piezoelectric plate 4a is subjected to polarization in its thickness direction.

The direction of polarization of the piezoelectric plate 4a is not limited to its thickness direction, and it may be polarized in another direction.

A mass load member 6 is mounted on the upper surface of the vibrating-plate main section 3g such that a binder 5 is disposed therebetween. An appropriate binder, such as glass paste, can be used as the binder 5. For the present embodiment, the binder 5 and the mass load member 6 are made of the same material, and they are coupled together by integral firing.

The mass load member 6 can be made of any material as long as it can load mass to the vibrating-plate main section 3g. Preferably, the material may be metal or ceramic because it can load sufficient mass. For the present embodiment, the mass load member 6 is made of the same ceramic as that of the binder 5 and the vibrating plate 3.

Figure 1B:
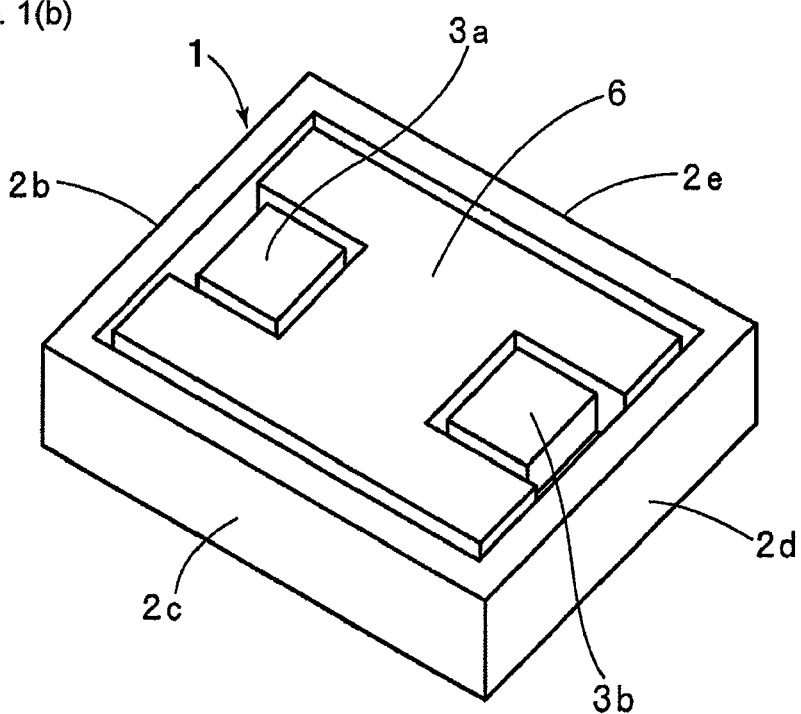
Figure 3:
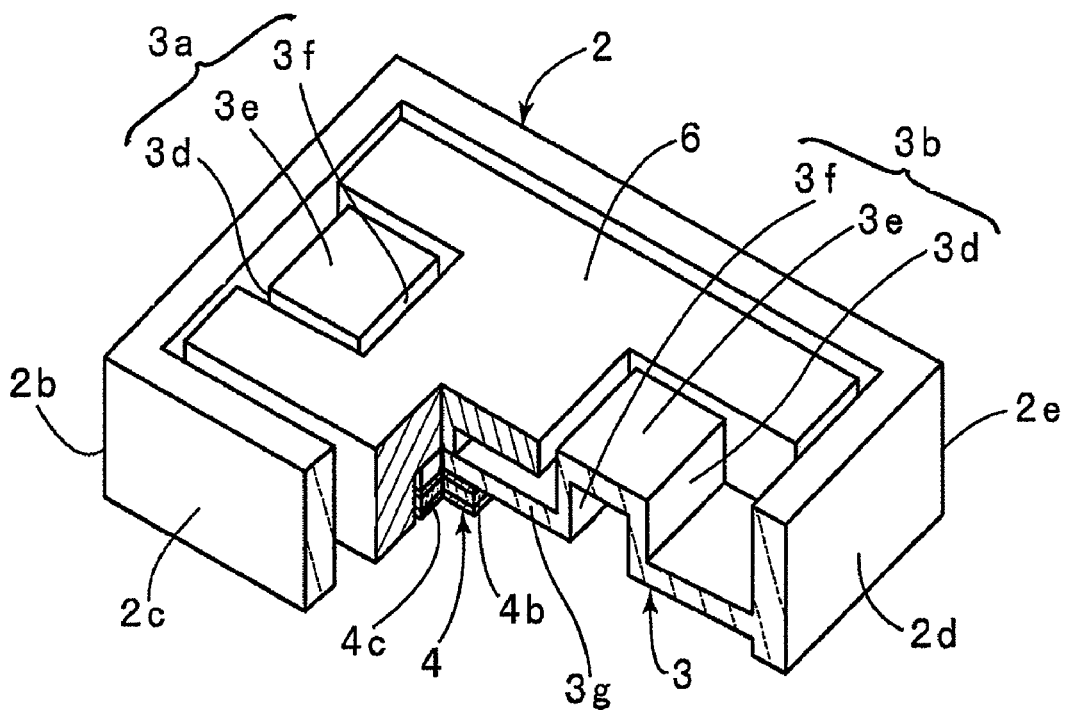
FIG. 3 is a partial cross-sectional perspective view for describing an internal structure of a piezoelectric generator according to an embodiment of the present invention.
Figure 4:
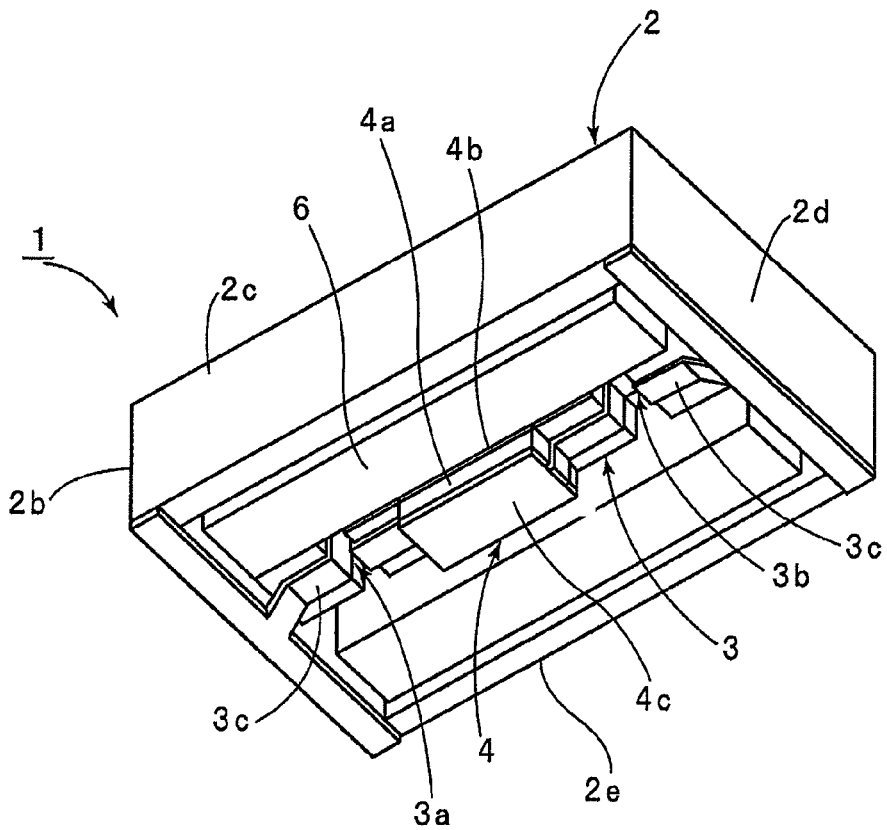
FIG. 4 is a perspective view of a piezoelectric generator according to an embodiment of the present invention seen from below.

The mass load member 6 has a substantially H-shaped planar figure, as illustrated in FIGS. 1(b) and 3. That is, the mass load member 6 is formed so as to have an area larger than the portion bound by the binder 5. This enables larger mass to be loaded to the vibrating-plate main section 3g.

The mass load member 6 has a substantially H-shaped form so as to occupy almost all regions, including the portion directly above the vibrating-plate main section 3g, other than the portion in which the bends 3a and 3b are disposed within an opening having the shape of a rectangular frame of the support member 2. That is, the mass load member 6 is formed so as to be close to lateral portions of the bends 3a and 3b. The use of the mass load member 6 having such a large area enables large mass to be loaded to the vibrating-plate main section 3g.

However, the planar figure of the mass load member 6 is not limited to the above example. The mass load member 6 may be disposed only directly above the vibrating-plate main section 3g. Alternatively, the mass load member 6 may be disposed only directly above the vibrating-plate main section 3g and on the both sides in its width direction.

The piezoelectric generator 1 according to the present embodiment is fixed to a portion to which vibration or distortion is applied. This fixation is performed by fixing any portion of the outer surface of the support member 2 to an installation portion. When vibration, distortion, or acceleration is applied from the installation portion, the vibrating-plate main section 3g and the piezoelectric element 4 supported by the bends 3a and 3b vibrate in the directions indicated by the arrow A illustrated in FIG. 1(a). That is, they vibrate vertically in FIG. 1(a). Because the mass load member 6 is mounted on the vibrating-plate main section 3g, larger amplitude is obtainable. Due to the above vibration, larger electric power is extracted from the electrodes 4b and 4c on the basis of the piezoelectric effect.

Also, because the vibration body including the vibrating-plate main section 3g and the piezoelectric element 4 is supported at both ends, in addition, because it is supported employing the first and second bends 3a and 3b, it is not susceptible to the effects resulting from conditions of installation. That is, the effects resulting from the installation portion at which the support member 2 is fixed are reduced by the bends 3a and 3b, which are the above-described elastic support structure, the effects resulting from conditions of installation do not tend to reach the vibration portion. Therefore, variations in the resonant frequency in the vibration portion including the vibrating-plate main section 3g and the piezoelectric element 4 caused by conditions of installation does not tend to occur. Accordingly, the piezoelectric generator 1 exhibiting reduced variations in the power generation efficiency can be provided.

In particular, because the first and second bends 3a and 3b are symmetrically arranged such that the piezoelectric element 4 is positioned therebetween, the tendency for the resonance frequency to vary is further reduced. However, the first and second bends 3a and 3b may not be symmetrically arranged.

Next, one example method of manufacturing the above piezoelectric generator 1 is described.

Figure 5:
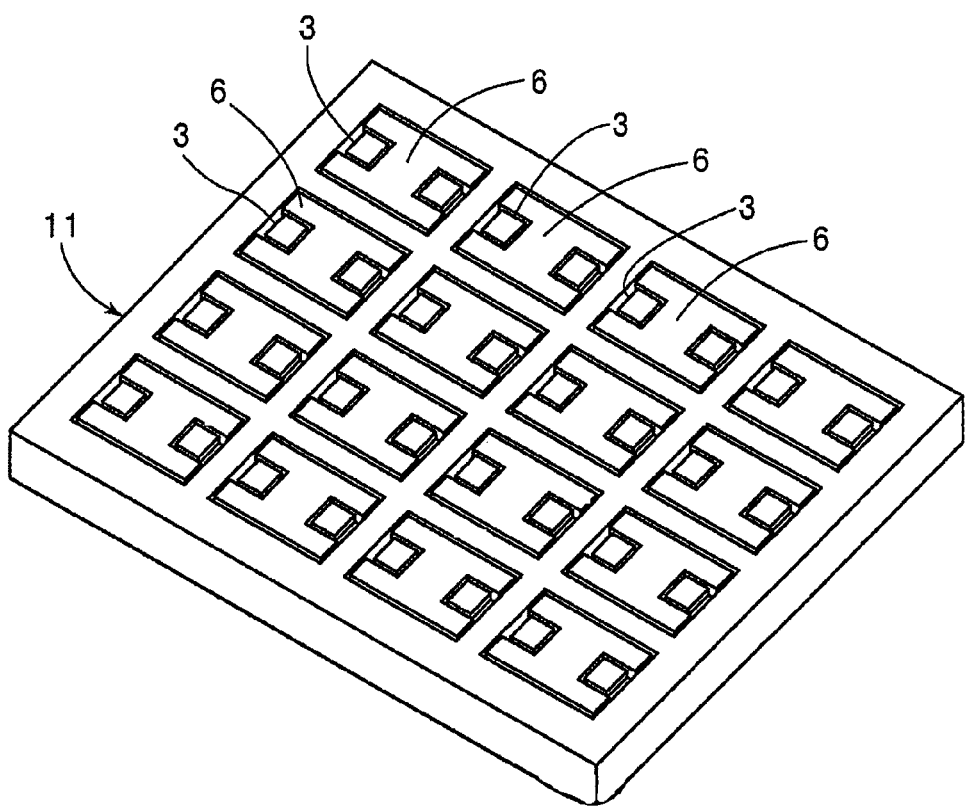
FIG. 5 is a perspective view for describing a structure of a mother prepared for obtaining a piezoelectric generator according to an embodiment of the present invention.
Figure 6:
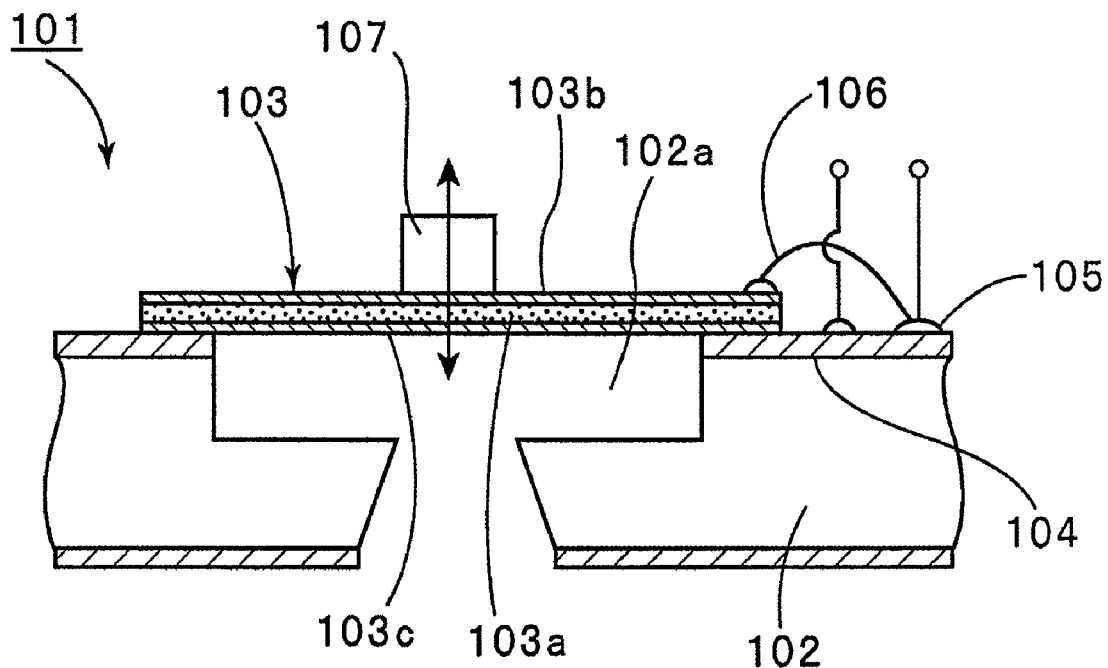
FIG. 6 is a partial cut-away cross-sectional view that illustrates one example of a traditional piezoelectric generator.

In manufacturing the above piezoelectric generator 1, as previously described, the use of the integral firing technique can enhance the manufacturing efficiency and reduce the cost. More specifically, a mother structure in which a plurality of support members 2, vibrating plates 3, and piezoelectric elements 4 are included is obtained by the integral firing technique. After such a mother structure is obtained, the mass load member 6 is bound in the rectangular opening of the support member 2 of each of the piezoelectric elements 4 with the binder disposed therebetween, as illustrated in the perspective view of FIG. 5. In this way, a mother piezoelectric element assembly 11 illustrated in FIG. 5 is obtainable. The mother structure is cut in its thickness direction such that the mother piezoelectric element assembly 11 is divided into individual piezoelectric elements 4. In this way, a plurality of piezoelectric generators 1 is obtainable by obtaining a mother structure in which a mother vibrating plate, a plurality of piezoelectric elements, and a plurality of support members are integrated with each other by the use of the integral firing technique and then cutting the structure in a downstream process. Therefore, the manufacturing efficiency can be improved, and the cost can be reduced.

The support member 2, vibrating plate 3, and piezoelectric element 4 are formed by the use of the integral firing technique. However, it is not necessary to use the same ceramic material in these components. That is, ceramic forming the support member 2, ceramic forming the vibrating plate 3, and ceramic forming the piezoelectric plate 4a of the piezoelectric element 4 do not have to be the same. In response to required characteristics, an appropriate ceramic material may be preferably used. For example, it may be preferable that the support member 2 be made using ceramic having good mechanical strength and electrical insulation, such as $Al_2O_3$ or $ZrO_2$. It may be preferable that the vibrating plate 3 be made using ceramic that has sufficient mechanical strength even when it is thin to some extent, can achieve an elastic support structure of the bends 3a and 3b, and has good toughness, for example, $Al_2O_3$ or $ZrO_2$.

As the ceramic forming the piezoelectric plate 4a, aside from the previously described PZT piezoelectric ceramics, appropriate piezoelectric ceramics exhibiting good piezoelectricity may also preferably be used. The material of the above-described first and second electrodes 4b and 4c is also not limited to particular one, and conductive paste containing appropriate metal, such as aluminum, copper, platinum, or silver-palladium alloy, can also be used.

However, it may be preferable that the vibrating plate 3 and the support member 2 be made of the same ceramic material because both can be integrated more strongly by the use of the integral firing technique.

The present invention features supporting the vibrating-plate main section 3g, to which the piezoelectric element 4 is bonded, at both ends employing the first and second bends. Therefore, after being formed separately, the vibrating plate 3 and the piezoelectric element 4 may be bonded together by the use of an appropriate bond. Similarly, as for the support member 2 and the vibrating plate 3, the vibrating plate 3 may be fixed by the use of an appropriate bond to the support member 2 formed in advance.

Accordingly, the support member 2 and the vibrating plate 3 may also be made of a material other than ceramic. For example, the support member 2 may be made of a synthetic resin or metal, and the vibrating plate 3 may also be made of metal or a synthetic resin.

REFERENCE NUMERALS LIST

1 piezoelectric generator
2 support member.
2a base
2b-2e side walls
3 vibrating plate
3a bend
3b bend
3c coupling section
3d first section
3e second section
3f third section
3g vibrating-plate main section
4 piezoelectric element
4a piezoelectric plate
4b, 4c first and second electrodes
5 binder
6 mass load member
11 piezoelectric element assembly

The invention claimed is:

1. A piezoelectric generator comprising:
a vibrating plate including a vibrating-plate main section, a first bend disposed at a first side of the vibrating-plate main section, and a second bend disposed at a second side of the vibrating-plate main section opposite the first side;
a mass load member attached to a surface of the vibrating plate opposite to the piezoelectric element;
a piezoelectric element disposed adjacent the vibrating-plate main section such that the piezoelectric element is positioned between the first and second bends, the piezoelectric element including a piezoelectric ceramic body and first and second electrodes, the piezoelectric ceramic body having first and second surfaces facing each other, the first and second electrodes being disposed on the first and second surfaces of the piezoelectric ceramic body, respectively; and
a support member supporting the vibrating plate at a location outside the first and second bends of the vibrating plate relative to the piezoelectric element.

2. The piezoelectric generator according to claim 1, wherein the first and second bends are symmetrical with respect to the piezoelectric element.

3. The piezoelectric generator according to claim 1, wherein the vibrating plate is ceramic and integral with the piezoelectric element.

4. The piezoelectric generator according to claim 3, wherein the support member is ceramic and integral with the vibrating plate.

5. The piezoelectric generator according to claim 1, wherein the mass load member is attached to the vibrating plate with a binder.

6. The piezoelectric generator according to claim 1, wherein the mass load member is ceramic.

7. A piezoelectric generator comprising:
a vibrating plate including a vibrating-plate main section, a first bend disposed at a first side of the vibrating-plate main section, and a second bend disposed at a second side of the vibrating-plate main section opposite the first side;
a mass load member attached to the vibrating plate;
a piezoelectric element disposed adjacent the vibrating-plate main section such that the piezoelectric element is positioned between the first and second bends, the piezoelectric element including a piezoelectric ceramic body and first and second electrodes, the piezoelectric ceramic body having first and second surfaces facing each other, the first and second electrodes being disposed on the first and second surfaces of the piezoelectric ceramic body, respectively; and
a support member supporting the vibrating plate at a location outside the first and second bends of the vibrating plate relative to the piezoelectric element,
wherein the mass load member is substantially H-shaped.

8. A piezoelectris generator comprising:
a vibrating plate including a vibrating-plate main section, a first bend disposed at a first side of the vibrating-plate main section, and a second bend disposed at a second side of the vibrating-plate main section opposite the first side;
a mass load member attached to the vibrating plate;
a piezoelectric element disposed adjacent the vibrating-plate main section such that the piezoelectric element is positioned between the first and second bends, the piezoelectric element including a piezoelectric ceramic body and first and second electrodes, the piezoelectric ceramic body having first and second surfaces facing each other, the first and second electrodes being disposed on the first and second surfaces of the piezoelectric ceramic body, respectively; and
a support member supporting the vibrating plate at a location outside the first and second bends of the vibrating plate relative to the piezoelectric element,
wherein the mass load member is shaped so as to correspond only to the vibrating-plate main section.

* * * * *